(12) United States Patent
Hosoda et al.

(10) Patent No.: US 7,768,286 B2
(45) Date of Patent: Aug. 3, 2010

(54) ELECTRONIC DEVICE TESTING APPARATUS AND TEMPERATURE CONTROL METHOD IN AN ELECTRONIC DEVICE TESTING APPARATUS

(75) Inventors: Shigeru Hosoda, Tokyo (JP); Masaaki Ogawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 113 days.

(21) Appl. No.: 11/990,435

(22) PCT Filed: Aug. 25, 2005

(86) PCT No.: PCT/JP2005/015481
§ 371 (c)(1),
(2), (4) Date: Jun. 12, 2008

(87) PCT Pub. No.: WO2007/023557
PCT Pub. Date: Mar. 1, 2007

(65) Prior Publication Data
US 2009/0051381 A1    Feb. 26, 2009

(51) Int. Cl.
*G01R 31/02* (2006.01)
(52) U.S. Cl. .......... 324/760; 324/765
(58) Field of Classification Search .......... None
See application file for complete search history.

(56) References Cited
U.S. PATENT DOCUMENTS
6,890,097 B2 * 5/2005 Tanaka ............ 374/185

6,919,734 B2 * 7/2005 Saito et al. .......... 324/760
7,345,495 B2 * 3/2008 Dangelo et al. .......... 324/760

FOREIGN PATENT DOCUMENTS
JP    A-2001-165990    6/2001
JP    A-2004-245756    9/2004

OTHER PUBLICATIONS
International Search Report of the International Searching Authority mailed on Dec. 6, 2005 for the corresponding International patent application No. PCT/JP2005/015481.

* cited by examiner

*Primary Examiner*—Minh N Tang
(74) *Attorney, Agent, or Firm*—Posz Law Group, PLC

(57) ABSTRACT

An electronic device testing apparatus is described that includes a temperature measurement device for measuring a temperature of an IC device based on a voltage of a thermal diode provided inside the IC device, a temperature sensor and a temperature applying device provided to a pusher, and a temperature control portion for calculating a correction value from a difference of a measurement temperature of a predetermined IC device by the temperature measurement device and that by the temperature sensor. A temperature of the IC device to be tested is measured by the temperature measurement device at an actual operation, and the temperature applying device is controlled based on the obtained measurement temperature and the correction value calculated by the temperature control portion.

11 Claims, 3 Drawing Sheets

ELECTRONIC DEVICE TESTING APPARATUS AND TEMPERATURE CONTROL METHOD IN AN ELECTRONIC DEVICE TESTING APPARATUS

TECHNICAL FIELD

The present invention relates to an electronic device testing apparatus for testing electronic devices, such as IC devices, capable of controlling a temperature of the electronic devices and a temperature control method in an electronic device testing apparatus.

BACKGROUND ART

In a production process of electronic devices, such as IC devices, an electronic device testing apparatus is necessary for testing finally produced electronic devices.

A test of IC devices by using an electronic device testing apparatus is conducted, for example, as explained below. After conveying IC devices to be tested to above a test head attached with sockets, the IC devices are pressed to be attached to the sockets, so that connection terminals of the sockets are brought to contact with external terminals of the IC devices. As a result, the IC devices are electrically connected to a tester body via the sockets, the test head and a cable. Then, a test signal supplied from the tester body to the test head through the cable is applied to each of the IC devices, a response signal read from each IC device is sent to the tester body through the test head and the cable, consequently, electric characteristics of the IC devices are measured.

The test explained above is often conducted by giving a thermal stress to the IC devices to be tested. As a method of giving a thermal stress to the IC devices, for example, a method of heating the IC devices to a predetermined temperature by a heat plate in advance before conveying them to the test head is used. Also, a method of furthermore providing a heater to a device for conveying (picking up) and pressing the IC devices and heating the IC devices by the heater is used.

To accurately control a heating temperature of the IC devices to be tested, a temperature of the IC devices has to be measured. Here, some kinds of IC devices are equipped with a thermal diode therein, and a temperature of the IC devices can be measured by measuring a voltage of the thermal diode.

DISCLOSURE OF THE INVENTION

Problem to be Solved by the Invention

However, a temperature of an IC device to be tested measured by using a thermal diode is often not accurate, and it is difficult to control a heating temperature of the IC device accurately by using the measured temperature as it is.

The present invention was made in consideration of the above circumstances and has as an object thereof to provide an electronic device testing apparatus and a temperature control method capable of accurately controlling a temperature of an electronic device by using a temperature detector inside the electronic device.

Means for Solving the Problem

To attain the above object, according to the first invention, there is provided an electronic device testing apparatus, comprising a first temperature measurement device for measuring an internal temperature of an electronic device based on a detection signal from a temperature detector provided inside the electronic device; a second temperature measurement device provided outside of the electronic device for measuring a standard temperature and capable of measuring a temperature of the electronic device in a state of being thermally connected to the electronic device; a temperature control device thermally connected to the electronic device and capable of controlling a temperature of the electronic device by heating or absorbing heat; and a calibration means for calculating a correction value for the first temperature measurement device from a difference of a first measurement temperature by the first temperature measurement device and a second measurement temperature as a standard temperature by the second temperature measurement device in a state, where the temperature control device and the electronic devices are made to be a predetermined constant temperature; and wherein an internal temperature of an electronic device to be tested is measured by the first temperature measurement device, the internal temperature of the electronic device is specified based on the obtained first measurement temperature and a correction value calculated by the calibration means, and the internal temperature of the electronic device is made to be a predetermined temperature by controlling the temperature control device to heat or absorb heat (Invention 1).

As the temperature detector provided inside the electronic devices, for example, a thermal diode and an electrostatic-protecting diode, etc. may be mentioned. The temperature detector does not has to be originally provided for measuring a temperature of the electronic device, and it is sufficient if it serves to measure a temperature of the electronic device by some method.

Generally, a measurement temperature of an electronic device by using a temperature detector provided inside the electronic device is not always accurate, but by using a correction value calculated by the calibration means as the above invention (Invention 1), an accurate temperature of the electronic device can be obtained by utilizing the temperature detector provided inside the electronic device, consequently, temperature control of the electronic device can be made more accurately.

In the above invention (Invention 1), the temperature detector may be a thermal diode formed inside the electronic device (Invention 2). A temperature of the electronic device under tested sometimes dynamically changes, however, since a thermal diode generally has high-speed responsiveness in temperature detection, electronic devices with a changing temperature can be maintained in a predetermined temperature range during the test.

In the above invention (Invention 1), preferably, the second temperature measurement device is provided to a pusher, which presses external terminals of the electronic device toward a direction of a socket to be connected and is thermally connected to the electronic device (Invention 3). Since the pusher directly contacts electronic devices, a temperature of the electronic devices can be accurately measured by providing the second temperature measurement device to the pusher.

In the above invention (Invention 1), preferably, the temperature control device is provided to a pusher, which presses external terminals of the electronic device toward a direction of a socket to be connected and is thermally connected to the electronic device (Invention 4). Since the pusher directly contacts electronic devices, a temperature control of the electronic devices can be effectively made by providing the second temperature control device to the pusher.

In the above invention (Invention 1), preferably, the calibration means is performed at the time of switching a kind of electronic devices to be tested (Invention 5), alternately, a means for prompting an operator to perform the calibration means (for example, display of a message on a monitor and voice guidance from a speaker, etc.) at the time of switching a kind of electronic devices to be tested is provided (Invention 6). It is because a correction value obtained by the calibration means normally differs according to kinds of electronic devices. Note that when performing the calibration means for each of all electronic devices to be tested, the effect on the throughput becomes large.

Also, in the above invention (Invention 1), preferably, the calibration means is performed before starting a test on each lot of electronic devices (Invention 7), alternately, a means for prompting an operator to perform the calibration means (for example, display of a message on a monitor and voice guidance from a speaker, etc.) before starting a test on each lot of electronic devices is provided (Invention 8). It is because even in the case of the same kind of electronic devices, the electronic devices or characteristics of the temperature detectors therein may change due to processes between lots and the correction value may change in some cases.

According to the second invention, there is provided a temperature control method in an electronic device testing apparatus, for measuring an internal temperature of an electronic device based on a detection signal from a temperature detector provided inside the electronic device, measuring a standard temperature of the electronic device by a temperature measurement device provided outside of the electronic device and thermally connected to the electronic device, calculating a correction value of the temperature detector from a difference of both measurement temperatures measured as above and storing the same in advance; and controlling an internal temperature of the electronic device to a predetermined temperature by heating or absorbing heat of the electronic device based on an internal measurement temperature obtained by measuring an internal temperature of the electronic device based on a detection signal from a temperature detector of the electronic device tested at an actual operation and the correction value stored for the same kind of electronic device as the electronic device (Invention 9).

In the above invention (Invention 9), preferably, calculation of the correction value is performed at the time of switching a kind of electronic devices (Invention 10) and, particularly preferably, calculation of the correction value is performed before starting a test on each lot of electronic devices (Invention 11).

According to the third invention, there is provided an electronic device testing apparatus, comprising a first temperature measurement device for measuring an internal temperature of an electronic device by receiving a signal from a temperature detector provided inside the electronic device; a second temperature measurement device for measuring a standard temperature, which is provided outside of the electronic device and capable of measuring a temperature of the electronic device in a state of being thermally connected to the electronic device; a temperature control device thermally connected to the electronic device and capable of controlling a temperature of the electronic device by heating or absorbing heat; and a calibration means for calculating a correction value for the first temperature measurement device from a difference of a first measurement temperature by the first temperature measurement device and a second measurement temperature as a standard temperature by the second temperature measurement device in a state, where the temperature control device and the electronic devices are made to be a predetermined constant temperature (Invention 12).

Advantageous Effect of the Invention

According to the present invention, temperature control of an electronic device can be accurately made by using a temperature detector inside of the electronic device.

EXPLANATION OF REFERENCES

1 . . . electronic device testing apparatus
10 . . . electronic device handling apparatus (handler)
20 . . . test head
150 . . . pusher
153 . . . temperature applying device (temperature control device)
154 . . . temperature sensor (second temperature measurement device)
51 . . . temperature measurement device (first temperature measurement device)
D . . . IC device (electronic device)

BEST MODE FOR CARRYING OUT THE INVENTION

Below, an embodiment of the present invention will be explained based on the drawings.

Figure 1:
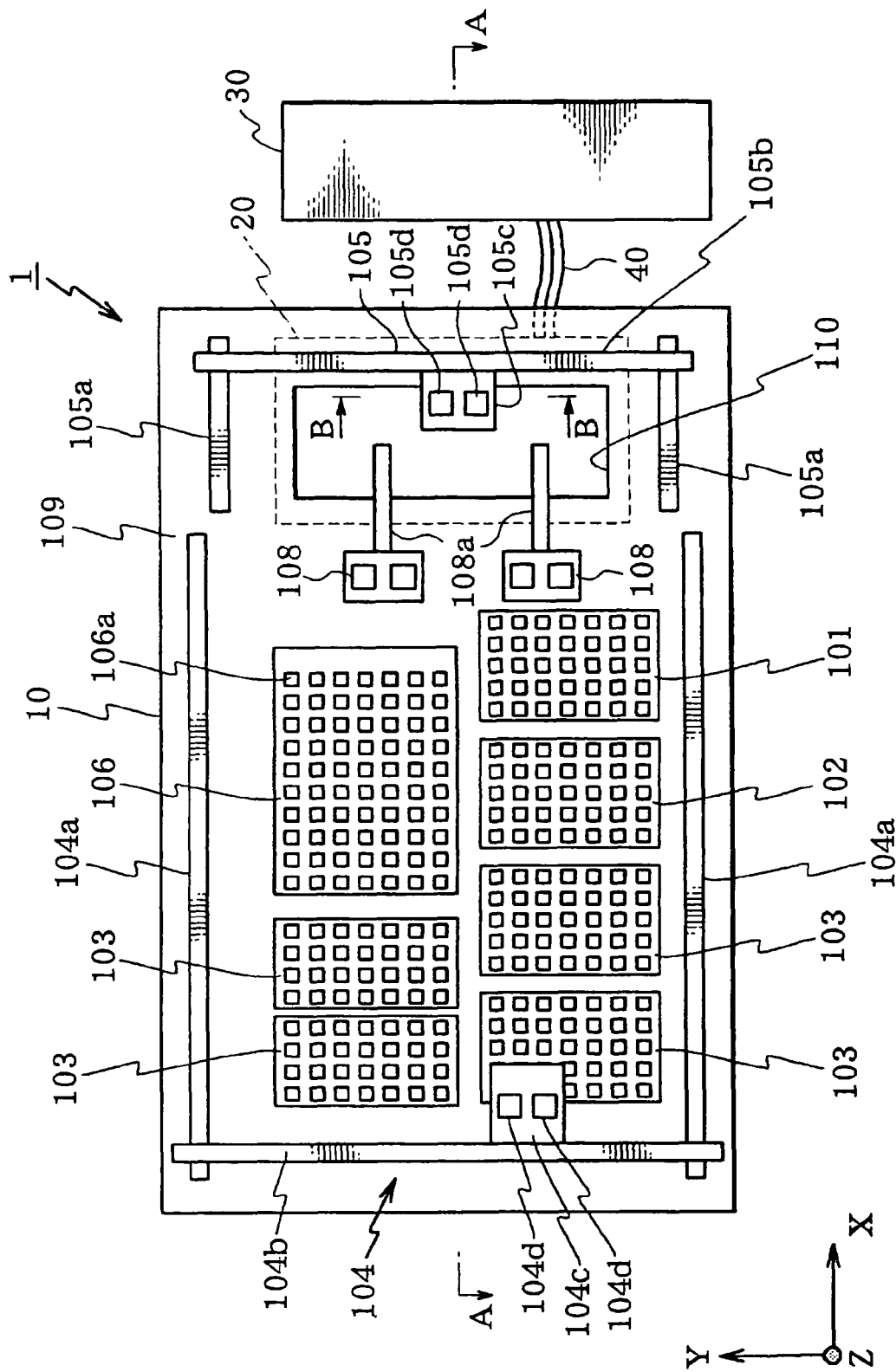
FIG. 1 is a plan view showing an electronic device testing apparatus according to an embodiment of the present invention.
Figure 2:
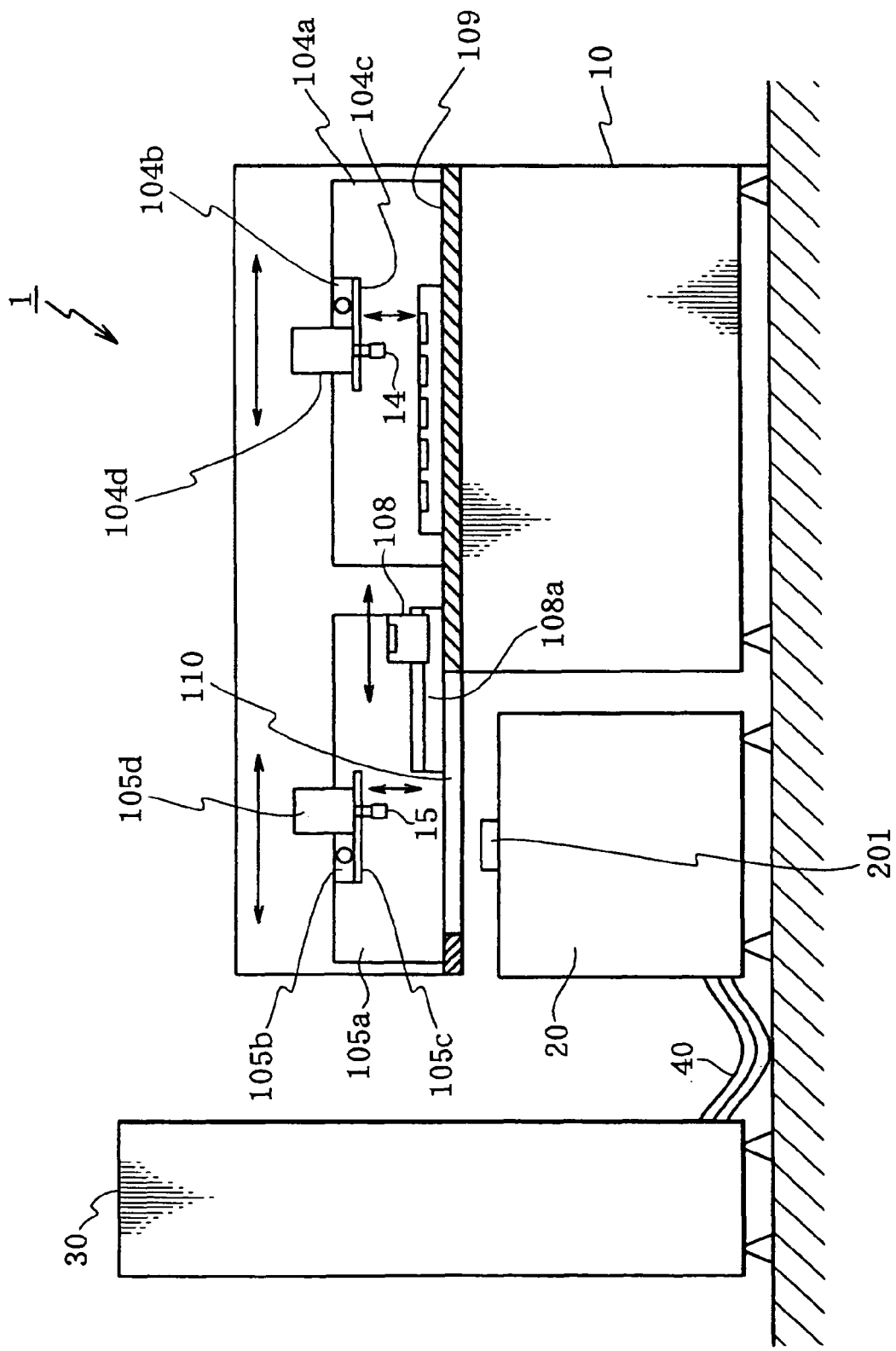
FIG. 2 is a side view of a section (A-A section) of a part of the electronic device testing apparatus in FIG. 1.

As shown in FIG. 1 and FIG. 2, an electronic device testing apparatus 1 comprises an electronic device handling device apparatus (hereinafter, referred to as a "handler") 10, a test head 20 and a tester body 30. The test head 20 and the tester body 30 are electrically connected via a cable 40.

The handler 10 is provided with a substrate 109; and an empty tray 101, a supply tray 102, classification trays 103, two X-Y conveyors 104 and 105, a heat plate 106 and two buffer portions 108 are provided on the substrate 109. Also, an opening portion 110 is formed on the substrate 109 and, as shown in FIG. 2, it is configured that a contact portion 201 of the test head 20 arranged on the back surface side of the handler 10 is attached with IC devices D through the opening portion 110 of the substrate 109.

The electronic device testing apparatus 1 is configured to successively convey pre-test IC devices (an example of electronic devices) D loaded on the supply tray 102 of the handler 10 by the two X-Y conveyors 104 and 105, press against the contact portion 201 of the test head 20 by the X-Y conveyor 105, conduct a test on the IC devices D via the test head 20 and the cable 40 and, then, store post-test IC devices D to the classification trays 103 in accordance with the test results.

Note that, in the present embodiment, IC devices D equipped with a thermal diode therein as a temperature detector are to be tested. Both terminals of the thermal diode are assumed to be connected to external terminals in each of the IC devices D. Transition characteristics of a forward voltage obtained when flowing a minute constant current to a thermal diode differ depending on types of forming an integrated circuit and, particularly, IC devices by the same production process or the same production lot exhibit constant transition characteristics. Namely, a forward voltage value and a temperature coefficient ΔV/° C. at a certain junction temperature in the same production process or the same production lot exhibit approximated characteristics. Therefore, by measuring a voltage of the thermal diode, it is possible to obtain an accurate junction temperature (temperature at a junction part) of the integrated circuit and, furthermore, a temperature of the IC device D.

Below, the respective devices will be explained.

One X-Y conveyor 104 comprises two rails 104a provided along the X-axis direction, a rail 104b attached to the two rails 104a to be movable in the Y-axis direction, a mount base 104c movably attached to the rail 104b, and two IC device suction devices 104d attached to the mount base 104c. The rail 104b is movable in the X-axis direction and the mount base 104c is movable in the Y-axis direction, so that the IC device suction devices 104d can move in a range from the classification trays 103 to the supply tray 102, the empty tray 101, the heat plate 106 and the two buffer portions 108.

Figure 3:
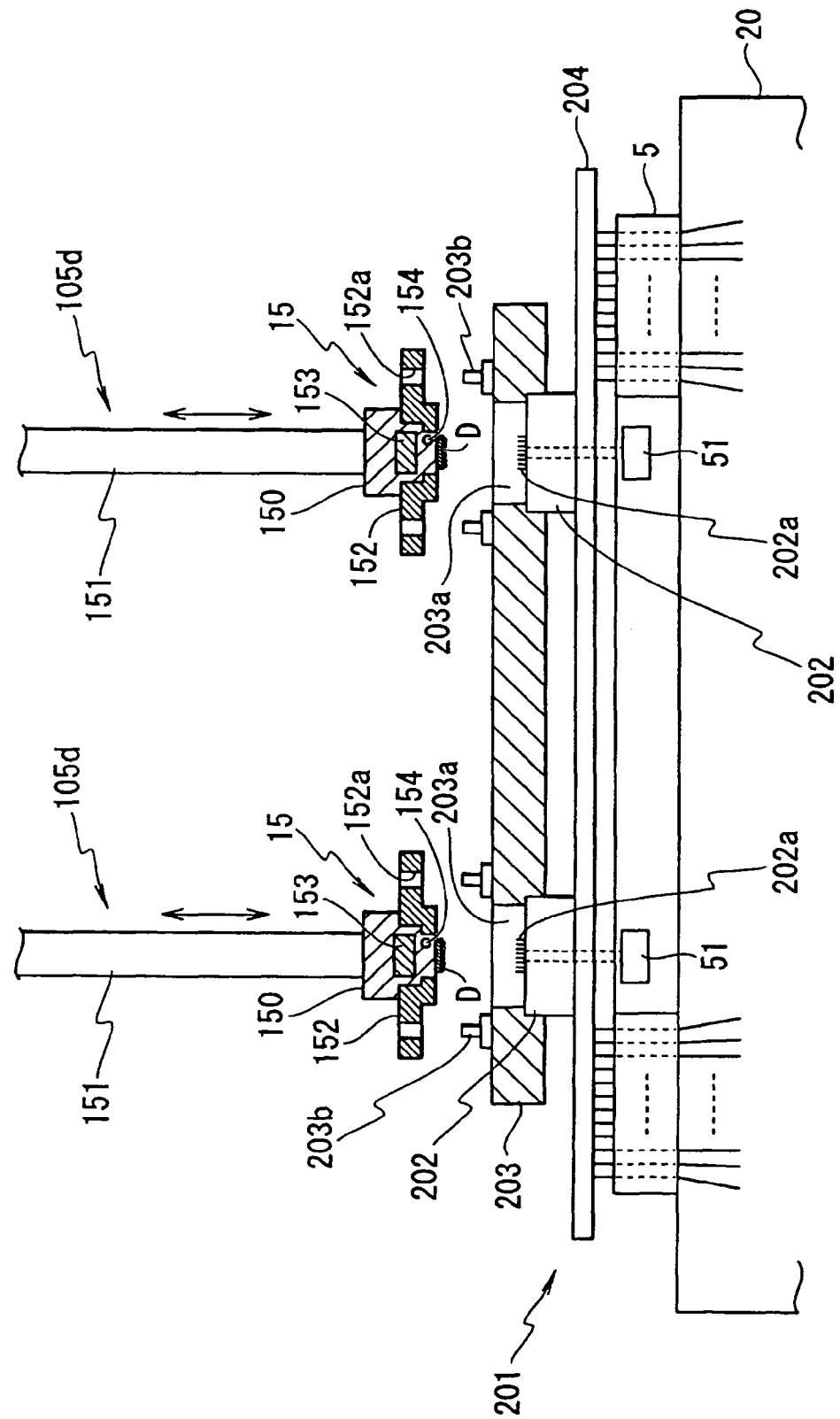
FIG. 3 is a sectional view (B-B sectional view in FIG. 1) showing details of a contact portion of a test head in the same electronic device testing apparatus.

As shown in FIG. 2 and FIG. 3, a lower end portion of each of the IC device suction devices 104d is provided with a suction portion 14 for picking up an IC device D, and the suction portion 14 is movable in the Z-axis direction (that is, in the vertical direction) by a Z-axis actuator (not shown) via a rod.

Note that, in the present embodiment, since the mount base 104c is provided with two IC device suction devices 104d, two IC devices D can be picked up, conveyed and released at a time.

The other X-Y conveyor 105 comprises two rails 105a provided along the X-axis direction, a rail 105b provided to the two rails 105a to be movable along the Y-axis direction, a mount base 105c movably attached to the rail 105b, and two IC device suction devices 105d attached to the mount base 105c. The rail 105b is movable in the X-axis direction and the mount base 105c is movable in the Y-axis direction, so that the IC device suction devices 105d can move in a range between the two buffer portions 108 and the test head 20.

As shown in FIG. 2 and FIG. 3, a lower end portion of each of the IC device suction devices 105d is provided with a suction/press portion 15 for picking up an IC device D and pressing the picked up IC device D against the contact portion 201 of the test head 20, and the suction/press portion 15 is movable in the Z-axis direction (that is, in the vertical direction) by a Z-axis actuator (not shown) via a rod 151.

Note that, in the present embodiment, since the mount base 105c is provided with two IC device suction devices 105d, two IC devices D can be picked up, conveyed and released at a time.

The two buffer portions 108 are configured to be able to move back and forth between operation ranges of the two X-Y conveyors 104 and 105 by rails 108a and actuators (not shown). The buffer portion 108 on the upper side in FIG. 1 performs an operation of transferring IC devices D conveyed from the heat plate 106 to the test head 20, and the buffer portion 108 on the lower side in FIG. 1 performs an operation of discharging IC devices D finished with a test at the test head 20. Due to provision of the two buffer portions 108, the two X-Y conveyors 104 and 105 can operate at a time without interfering with each other.

The supply tray 102 provided in the operation range of the X-Y conveyor 104 on the substrate 109 is a tray for loading pre-test IC devices D, and the classification trays 103 are trays for storing post-test IC devices D by classifying them in accordance with the test results. Four classification trays 103 are provided in the present embodiment.

Also, the heat plate 106 provided on the substrate 109 is, for example, a metal plate equipped with a heater, and a plurality of recessed portions 106a for IC devices D to be dropped are formed. Pre-test IC devices D are transferred by the X-Y conveyor 104 from the supply tray 102 to the recessed portions 106a. The heat plate 106 is a heat source for applying a predetermined thermal stress to IC devices D, and IC devices D are heated to a predetermined temperature by the heat plate 106 and, then, mounted on the contact portion 201 of the test head 20 via the buffer portion 108 on the upper side in FIG. 1.

As shown in FIG. 3, on the contact portion 201 of the test head 20, a socket 202 having probe pins 202a as connection terminals are fixed. The probe pins 202a are provided by the number and pitches corresponding to those of connection terminals of an IC device D and biased upwardly by a spring. The probe pins 202a are electrically connected to the tester body 30 via the test head 20.

The socket 202 is attached with a socket guide 203 having an opening portion 203a and guide pins 203b as shown in FIG. 3 and configured that an IC device D picked up and held by the suction/press portion 15 of the IC device suction device 105d is pressed against the socket 202 through the opening portion 203a.

The suction/press portion 15 is provided with a pusher 150 attached to a lower end portion of the rod 151 and a pusher base 152 for the pusher 150 to fit in. As explained above, when an IC device D is pressed against the socket 202, the guide pins 203b provided to the socket guide 203 are inserted to the guide holes 152a formed on the pusher base 152, consequently, the IC device D is aligned with the socket 202.

At the lower end portion of the pusher 150, a temperature sensor 154 capable of measuring a temperature of an IC device D picked up and held by the suction/press portion 15 is provided. Also, inside of the pusher 150 is provided with a temperature applying device 153 capable of heating or cooling an IC device D picked up and held by the suction/press portion 15. As the temperature applying device 153, for example, a heater, peltiert element and refrigerant, etc. may be used. The temperature sensor 154 and the temperature applying device 153 are electrically connected to a not shown temperature control portion. Note that it is preferable to provide a heat insulation material between the temperature sensor 154 and the temperature applying device 153.

The socket 202 is provided on the socket board 204, and a performance board 5 is arranged on the lower side of the socket board 204. The performance board 5 is provided with a temperature measurement device 51 for measuring a temperature of an IC device D by measuring a voltage of a thermal diode inside the IC device D. The temperature measurement device 51 is electrically connected to a not shown temperature control portion in the same way as the temperature sensor 154 and the temperature applying device 153.

Note that as the temperature sensor 154 of the pusher 150, those being stable with a small change over time, such as a platinum temperature sensor, is preferably used for measuring a standard temperature to be used also for temperature correction of the temperature measurement device 51 by using a thermal diode inside the IC device D.

The handler 10 is provided with a not shown monitor (display device). The monitor may be configured to display a message for an operator to prompt execution of later explained calibration at the time of switching a kind of IC devices D and before starting a test on each lot of IC devices D. Furthermore, a control means for prohibiting conduction of a test may be provided if desired when calibration is yet to be made at the time of switching a kind of IC devices.

In the electronic device testing apparatus 1 according to the present embodiment, calibration is executed as below at the time of switching a kind of IC devices D and before starting a test on each lot of IC devices D. The calibration may be performed automatically or manually.

The IC device suction devices 104d of the X-Y conveyor 104 pick up and hold IC devices D loaded on the supply tray 102 of the handler 10 and transfer to the recessed portions 106a on the heat plate 106 and release the IC devices D above the recessed portions 106a. The IC devices D are heated to a predetermined temperature (for example, 60° C.) by being left for a predetermined time on the heat plate 106. The IC device suction devices 104d of the X-Y conveyor 104 pick up and hold the IC devices D heated to a predetermined temperature by the heat plate 106, transfer to the buffer portion 108 positioned on the left end of the rail 108a in FIG. 1 and release the IC devices D above the buffer portion 108.

The buffer portion 108 loaded with the IC devices D moves to the right end of the rail 108a in FIG. 1. The IC device suction devices 105d of the X-Y conveyor 105 pick up and hold the IC devices D on the moved buffer portion 108 and transfer to the contact portion 201 of the test head 20. Then, the pushers 150 of the IC device suction devices 105d press the IC devices D against the sockets 202 through the opening portion 110 of the substrate 109 to bring external terminals of the IC devices D contact with the probe pins 202a of the sockets 202.

At this time, a measurement temperature $T_1$ of each of the IC devices D is measured by the temperature sensor 154 of the pusher 150, and a voltage value at the time of applying a constant current to a thermal diode inside each of the IC device D is measured by the temperature measurement device 51 of the performance board 5, so that a measurement temperature $T_2$ of each of the IC devices D is obtained based on the measured voltage value. The value of the measurement temperature $T_2$ at this time is assumed to be a non-corrected temperature value used all the time from the first to the last. The information is sent to the temperature control portion.

The temperature control portion calculates a difference $(T_1-T_2)$ of the measurement temperature $T_1$ by the temperature sensor 154 and the non-corrected measurement temperature $T_2$ by the temperature measurement device 51 and registers (stores) the result as a correction value $T_3$. For example, when the measurement temperature $T_1$ by the temperature sensor 154 is 60° C. and the non-corrected measurement temperature $T_2$ by the temperature measurement device 51 is 58° C., 2° C. as a difference of the two is registered as the correction value $T_3$. Here, it is often the case that the devices are tested under almost constant set temperature conditions in both of a high temperature test and a low temperature test, so that it is not necessary to correct all temperature range. Note that when desiring a test under a freely set temperature condition, differences $(T_1-T_2)$ between a plurality of temperature points (for example, 120° C., 100° C. and 80° C.) are calculated, respectively (for example, 2° C., 0° C. and −2° C.). From them, a coefficient (2° C.−(−2° C.))/(120° C.−80° C.)=0.1 is obtained. By registering the obtained coefficient with a correction value $T_3$, an operation under freely set temperature condition becomes possible.

The correction value $T_3$ obtained as above normally differs according to kinds of IC devices D, so that the calibration is performed at the time of switching a kind of IC devices D. Also, characteristics of thermal diodes in IC devices D may change due to difference of processes between lots even if the kinds of the IC devices D are the same, therefore, the calibration is preferably performed also before starting a test on each lot of IC devices D.

Next, an operation of the electronic device testing apparatus 1 at an actual operation will be explained.

An operation until bringing an IC device D contact with the socket 202 is the same as that in the calibration explained above.

When the pusher 150 presses the IC device D against the socket 202 of the contact portion 201 and external terminals of the IC device D are connected to the probe pins 202a of the socket 202, a voltage of a thermal diode inside the IC device D is measured by the temperature measurement device 51 to obtain a measurement temperature $T_4$ of the IC device D, and the information is sent to the temperature control portion.

The temperature control portion reads the correction value $T_3$ registered in the calibration and uses a value obtained by adding the correction value $T_3$ to the measurement temperature $T_4$ measured by the temperature measurement device 51 $(T_4+T_3)$ as an actual temperature $T_5$ of the IC device D. Then, when the actual temperature $T_5$ is deviated from a targeted temperature, the temperature applying device 153 inside the pusher 150 is controlled to make the IC device D to be the targeted temperature. In addition, a temperature of the heat plate 106 may be also controlled.

For example, when the measurement temperature $T_4$ measured by the temperature measurement device 51 is 59° C. and the correction value $T_3$ is 2° C., an actual temperature $T_5$ of the IC device D is considered to be 61° C.; and when the targeted temperature is 60° C., the temperature applying device 153 inside the pusher 150 is controlled to lower the temperature of the IC device D by 1° C. Also, for example, when the measurement temperature $T_4$ measured by the temperature measurement device 51 is 57° C. and the correction value $T_3$ is 2° C., an actual temperature $T_5$ of the IC device D is considered to be 59° C.; and when the targeted temperature is 60° C., the temperature applying device 153 inside the pusher 150 is controlled to raise the temperature of the IC device D by 1° C.

When a test on the device starts while continuously maintaining temperature control of the IC device D as explained above, a test signal is applied to the IC device D from the tester body 30 through the test head 20, and a response signal from the IC device D is sent to the tester body 30 through the test head 20. As a result, good and bad of the IC device D and ranks of each performance thereof are determined. Here, a power consumption of the IC device D dynamically changes due to the test condition, but the thermal diode inside the IC device D has high-speed responsiveness in temperature detection of a degree of several milliseconds or so, so that the test can be conducted by practically maintaining a predetermined temperature range.

When the test on IC devices D finishes, the device suction devices 105d of the X-Y conveyor 105 transfer the post-test IC devices D to the buffer portion 108 positioned at the right end of the rail 108a in FIG. 1, and the buffer portion 108 moves to the left end in FIG. 1. The IC device suction devices 104d of the X-Y conveyor 104 pick up and hold the post-test IC devices D from the buffer portion 108 and store them in the classification trays 103 in accordance with the test results.

Generally, a measurement temperature of IC devices D by using thermal diodes, etc. inside the IC devices D is not always accurate, but by using a correction value by the calibration as explained above, exact temperature control of the IC devices D becomes possible by utilizing high-speed responsiveness in temperature detection of the thermal diodes.

The embodiments explained above are described to facilitate understanding of the present invention and is not to limit the present invention. Accordingly, respective elements disclosed in the above embodiments include all design modifications and equivalents belonging to the technical scope of the present invention.

For example, the handler 10 explained above is a chamberless type handler, but a chamber type handler may be also used. In that case, in addition to the temperature applying device 153 of the pusher 150 or in place thereof, a temperature may be applied to the IC devices D by an air circulating inside the chamber.

Also, in the present embodiment, a temperature of IC devices was measured by using thermal diodes inside the IC devices, but the present invention is not limited to this and a temperature of the IC devices may be measured by using other temperature detectors (temperature-dependent elements) capable of measuring internal temperatures (junction temperatures) of the IC devices. For example, when there are input terminals and output terminals not used at conducting a test and when there are input terminals and output terminals not interfering in conducting the test, electrostatic protecting diodes connected to the input terminals and output terminals may be applied. Note that since these cases are susceptible to power source noises, processing for removing the power source noises becomes necessary. Furthermore, other temperature-dependent element exhibiting correlation with a junction temperature inside the IC device may be used.

Also, obtaining of a correction value $T_3$ may be performed under a constant temperature condition. Accordingly, the correction value $T_3$ can be obtained under any of a condition of no power consumption that a power source is not supplied to the IC devices and a condition close to an actual operation that a constant power is supplied to the IC devices. Note that, at the time of supplying a power source, when using an electrostatic protecting diode for temperature measurement, it becomes possible to be free from an effect of power source noises by measuring a temperature immediately after cutting off the power source supply.

Also, in the present embodiment, the case where only the temperature measurement device 51 uses a thermal diode inside the IC device was explained, however, there are some cases that the tester body 30 side wants to use the thermal diode for temperature detection inside the IC device. In that case, as a result of determining in advance whether a current to be applied to the thermal diode is supplied from the temperature measurement device 51 side or from the tester body 30 side and connecting to receive voltage signals of both ends of the thermal diode by the temperature measurement device 51, it can be used by the both. As a result, a state of a junction temperature of the IC device can be always perceived by both of the tester body 30 side and the handler 10 side.

Also, in the present embodiment, an explanation was made on the connection configuration wherein a signal from the thermal diode inside the IC device is received by the temperature measurement device 51, but it may be a connection configuration wherein a signal from the thermal diode is received on the tester body 30 side and a voltage value measured on the tester body 30 side or a measurement temperature $T_2$ obtained by calculation processing is supplied to the temperature measurement device 51 on the handler 10 side.

As a result, a state of a junction temperature of the IC device can be always perceived by both of the tester body 30 side and the handler 10 side.

INDUSTRIAL APPLICABILITY

An electronic device testing apparatus and a temperature control method of the present invention are advantageous for conducting a test requiring accurate temperature control of electronic devices.

The invention claimed is:

1. An electronic device testing apparatus, comprising:
    a first temperature measurement device for measuring an internal temperature of an electronic device based on a detection signal from a temperature detector provided inside the electronic device;
    a second temperature measurement device provided outside of said electronic device for measuring a standard temperature and for measuring a temperature of said electronic device in a state of being thermally connected to said electronic device;
    a temperature control device thermally connected to said electronic device for controlling a temperature of said electronic device by heating or absorbing heat; and
    a calibration means for calculating a correction value for said first temperature measurement device from a difference of a first measurement temperature by said first temperature measurement device and a second measurement temperature as a standard temperature by said second temperature measurement device in a state, where said temperature control device and said electronic device are made to be a predetermined constant temperature; and wherein
    said internal temperature of said electronic device to be tested is measured by said first temperature measurement device,
    the internal temperature of said electronic device is specified based on the obtained first measurement temperature and said correction value calculated by said calibration means, and
    the internal temperature of said electronic device is made to be said predetermined constant temperature by controlling said temperature control device to heat or absorb heat.

2. The electronic device testing apparatus as set forth in claim 1, wherein
    said temperature detector is a thermal diode formed inside of said electronic device.

3. The electronic device testing apparatus as set forth in claim 1, wherein
    said second temperature measurement device is provided to a pusher, which presses external terminals of said electronic device toward a direction of a socket to be connected and is thermally connected to said electronic device.

4. The electronic device testing apparatus as set forth in claim 1, wherein
    said temperature control device is provided to a pusher, which presses external terminals of said electronic device toward a direction of a socket to be connected and is thermally connected to said electronic device.

5. The electronic device testing apparatus as set forth in claim 1, wherein
    said calibration means is performed at the time of switching a kind of electronic devices to be tested.

6. The electronic device testing apparatus as set forth in claim 1, comprising a means for prompting an operator to perform said calibration means at the time of switching a kind of electronic devices to be tested.

7. The electronic device testing apparatus as set forth in claim 1, wherein said calibration means is performed before starting a test on each lot of electronic devices.

8. The electronic device testing apparatus as set forth in claim 1, comprising a means for prompting an operator to perform said calibration means before starting a test on each lot of electronic devices.

9. A temperature control method in an electronic device testing apparatus, comprising:

measuring an internal temperature of an electronic device based on a detection signal from a temperature detector provided inside said electronic device, measuring a standard temperature of said electronic device by a temperature measurement device provided outside of said electronic device and thermally connected to said electronic device, calculating a correction value of the temperature detector from a difference of both measurement temperatures measured as above and storing the same; and controlling said internal temperature of the electronic device to a predetermined temperature by heating or absorbing heat of the electronic device based on an actual internal temperature obtained by measuring said internal temperature of the electronic device based on said detection signal from said temperature detector of the electronic device tested at an actual operation and said correction value stored for the same kind of electronic device as the electronic device.

10. The temperature control method in the electronic device testing apparatus as set forth in claim 9, wherein calculation of said correction value is performed at the time of switching a kind of electronic devices.

11. The temperature control method in the electronic device testing apparatus as set forth in claim 9, wherein calculation of said correction value is performed before starting a test on each lot of electronic devices.

* * * * *